(12) United States Patent
Feng et al.

(10) Patent No.: US 11,527,598 B2
(45) Date of Patent: Dec. 13, 2022

(54) DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Binfeng Feng, Beijing (CN); Yonghui Luo, Beijing (CN); Fei Li, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 263 days.

(21) Appl. No.: 16/624,285

(22) PCT Filed: Aug. 1, 2019

(86) PCT No.: PCT/CN2019/098791
§ 371 (c)(1),
(2) Date: Dec. 18, 2019

(87) PCT Pub. No.: WO2020/025011
PCT Pub. Date: Feb. 6, 2020

(65) Prior Publication Data
US 2021/0335983 A1    Oct. 28, 2021

(30) Foreign Application Priority Data
Aug. 2, 2018 (CN) .......................... 201810872952.0

(51) Int. Cl.
| H01L 27/32 | (2006.01) |
| G02F 1/1362 | (2006.01) |
| H01L 51/52 | (2006.01) |

(52) U.S. Cl.
CPC .... *H01L 27/3276* (2013.01); *G02F 1/136209* (2013.01); *G02F 1/136286* (2013.01); *H01L 51/5284* (2013.01); *H01L 51/5293* (2013.01)

(58) Field of Classification Search
CPC ............ H01L 27/3276; H01L 51/5284; H01L 51/5293; H01L 27/3272; H01L 51/5246;
(Continued)

(56) References Cited

U.S. PATENT DOCUMENTS 9,395,471 B2 * 7/2016 Yi ........................ G02B 5/003
9,910,312 B2    3/2018 Yu et al.
(Continued)

FOREIGN PATENT DOCUMENTS

CN    103715219 A    4/2014
CN    105739166 A    7/2016
(Continued)

OTHER PUBLICATIONS

First Chinese Office Action dated Jun. 9, 2020, received for corresponding Chinese Application No. 201810872952.0, 21 pages.
(Continued)

*Primary Examiner* — S M Sohel Imtiaz
(74) *Attorney, Agent, or Firm* — Kinney & Lange, P.A.

(57) ABSTRACT

A display device includes: a display panel, a border pattern and a light shielding pattern. The display panel includes a display area and a non-display area surrounding the display area, the display panel further includes a plurality of signal lines in the display area and a plurality of signal leading lines in the non-display area, and the signal leading lines are electrically connected to the signal lines, respectively. The
(Continued)

border pattern is located on a light-exit side of the display panel. The light shielding pattern is located on the light-exit side and on a side of the border pattern adjacent to the display panel. An orthographic projection of the light shielding pattern on the display panel is located within the non-display area, and the light shielding pattern is configured to block light reflected by the signal leading lines from exiting out from the light-exit side.

15 Claims, 3 Drawing Sheets

(58) Field of Classification Search
CPC .............. H01L 27/32; G02F 1/136209; G02F 1/136286; G02F 1/133504; G02F 1/133507; G02F 1/133512; G02F 1/1335; G02F 1/13452
See application file for complete search history.

(56) References Cited

U.S. PATENT DOCUMENTS

| | | | |
|---|---|---|---|
| 10,126,586 | B2 | 11/2018 | Yu et al. |
| 10,353,234 | B2 | 7/2019 | Yu et al. |
| 10,684,502 | B2* | 6/2020 | Que .................. G02F 1/133512 |
| 2005/0062910 | A1* | 3/2005 | Chu ...................... G02F 1/1345 349/110 |
| 2006/0001823 | A1 | 1/2006 | Shih |
| 2008/0198314 | A1 | 8/2008 | Murade |
| 2010/0148192 | A1* | 6/2010 | Jung .................. H01L 51/5284 257/88 |
| 2013/0107178 | A1* | 5/2013 | Chiang ............. G02F 1/133509 349/104 |
| 2013/0127747 | A1* | 5/2013 | Ding .................. G06F 3/04166 345/173 |
| 2014/0098513 | A1* | 4/2014 | Yi ........................ G02B 5/003 362/19 |
| 2014/0347618 | A1* | 11/2014 | Shirai .................. G02F 1/1339 349/153 |
| 2016/0020264 | A1* | 1/2016 | Choo .................. H01L 27/3272 257/40 |
| 2017/0052405 | A1 | 2/2017 | Yu et al. |
| 2017/0123565 | A1* | 5/2017 | Li .......................... G06F 3/0443 |
| 2018/0014400 | A1 | 1/2018 | Dighde et al. |
| 2018/0149913 | A1 | 5/2018 | Yu et al. |
| 2018/0188590 | A1 | 7/2018 | Gu et al. |
| 2019/0025970 | A1* | 1/2019 | Kim ........................ G06F 3/044 |
| 2019/0041688 | A1 | 2/2019 | Yu et al. |
| 2019/0384095 | A1* | 12/2019 | Chen ................. G02F 1/133514 |
| 2021/0225981 | A1* | 7/2021 | Yi ........................ H01L 27/3276 |

FOREIGN PATENT DOCUMENTS

| | | |
|---|---|---|
| CN | 106057830 A | 10/2016 |
| CN | 106483706 A | 3/2017 |
| CN | 106646995 A | 5/2017 |
| CN | 107179642 A | 9/2017 |
| CN | 107247360 A | 10/2017 |
| CN | 108153071 A | 6/2018 |
| JP | 2008250309 A | 10/2008 |
| KR | 20160094544 A | 8/2016 |
| KR | 20170023337 A | 3/2017 |
| KR | 102341639 B1 | 12/2021 |

OTHER PUBLICATIONS

Russian Office Action dated Apr. 30, 2021, received for corresponding Russian Application No. 2020137117, 9 pages.
Russian Search Report dated Apr. 29, 2021, received for corresponding Russian Application No. 2020137117, 4 pages.
Notice of Acceptance for Patent Application, Australian Government IP Australia, dated Nov. 9, 2021, for corresponding Australian Application No. 2019314744, pp. 3.
First Indian Office Action dated Dec. 6, 2021, received for corresponding Indian Patent Application No. 202047047591, pp. 5.
Extended European Search Report dated Feb. 9, 2022, received for corresponding European Application No. 19832826.2, pp. 12.
Korean Office Action dated Jun. 16, 2022, for corresponding Korean Application No. 10-2020-736308.

* cited by examiner

DISPLAY DEVICE

CROSS-REFERENCE TO RELATED APPLICATION

This application is a Section 371 National Stage Application of International Application No. PCT/CN2019/098791, filed on Aug. 1, 2019, entitled "DISPLAY DEVICE", which claims the benefit of Chinese Patent Application No. 201810872952.0 filed on Aug. 2, 2018, the whole disclosure of which is incorporated herein by reference.

TECHNICAL FIELD

The present application relates to a field of display technology, and in particular to a display device.

BACKGROUND

With the rapid development of display technology, various types of display devices have gradually appeared, such as liquid crystal display devices (abbreviated as LCD), organic light-emitting display devices (abbreviated as OLED) and so on.

SUMMARY

Embodiments of the present disclosure provide a display device, including: a display panel, a border pattern and a light shielding pattern. The display panel includes a display area and a non-display area surrounding the display area, the display panel further includes a plurality of signal lines in the display area and a plurality of signal leading lines in the non-display area, the plurality of signal leading lines are electrically connected to the plurality of signal lines, respectively. The border pattern is located on a light-exit side of the display panel, and an orthographic projection of the border pattern on the display panel is located within the non-display area. The light shielding pattern is located on the light-exit side of the display panel and on a side of the border pattern adjacent to the display panel. An orthographic projection of the light shielding pattern on the display panel is located within the non-display area, and the light shielding pattern is configured to block light reflected by the plurality of signal leading lines from exiting out from the light-exit side.

In some embodiments, the plurality of signal lines include a plurality of data lines, and the plurality of signal leading lines include a plurality of data leading lines.

In some embodiments, the orthographic projection of the light shielding pattern on the display panel at least partially overlaps with the orthographic projection of the border pattern on the display panel.

In some embodiments, at least a part of the orthographic projection of the light shielding pattern on the display panel is located within a middle area between the display area of the display panel and the orthographic projection of the border pattern on the display panel.

In some embodiments, a vertical distance from the light shielding pattern to the display panel is smaller than a vertical distance from the border pattern to the display panel.

In some embodiments, the display device includes a touch electrode layer on the light-exit side of the display panel, and the light shielding pattern is arranged on the touch electrode layer.

In some embodiments, the display device further includes a layer structure on the light-exit side of the display panel, the light shielding pattern is connected to the layer structure, and the layer structure includes at least one of a packaging layer, a polarizer, a touch electrode layer, or an optical adhesive layer.

In some embodiments, the display device further includes a cover plate above the display panel, and the border pattern is formed on the cover plate.

In some embodiments, various portions of the light shielding pattern have inconsistent light transmittances.

In some embodiments, an area in which the plurality of signal leading lines are located includes a first leading line area and a second leading line area, and a light reflection capability of the first leading line area is higher than a light reflection capability of the second leading line area; and the light shielding pattern includes a first pattern for blocking reflected light from the first leading line area and a second pattern for blocking reflected light from the second leading line area, and a light transmittance of the first pattern is lower than a light transmittance of the second pattern.

In some embodiments, a distribution density of the signal leading lines in the first leading line area is greater than a distribution density of the signal leading lines in the second leading line area.

In some embodiments, each of the first pattern and the second pattern includes a hollow portion, and a proportion of the hollow portion in the first pattern is smaller than a proportion of the hollow portion in the second pattern.

In some embodiments, the light shielding pattern includes a plurality of strips, and a density of the strips in the first pattern is greater than a density of the strips in the second pattern.

In some embodiments, a material forming the light shielding pattern includes ink.

In some embodiments, a width of the light shielding pattern in a direction perpendicular to an edge of a display area closest to the light shielding pattern ranges from 0.5 mm to 1 mm.

In some embodiments, the display device further includes a fanout area in the non-display area, the plurality of signal leading lines are gathered in the fanout area, and an orthographic projection of the light shielding pattern on the display panel is located within the fanout area.

In some embodiments, an orthographic projection of the border pattern on the display panel surrounds the display area, and an area of a region surrounded by the orthographic projection of the border pattern on the display panel is greater than an area of the display area.

BRIEF DESCRIPTION OF THE DRAWINGS

In order to explain technical solutions of embodiments of the present disclosure more clearly, accompanying drawings used for describing the embodiments will be briefly introduced below. Obviously, the drawings in the following description are only used to illustrate some embodiments of the present disclosure. For those skilled in the art, other drawings may be obtained based on these drawings without paying creative efforts.

DETAILED DESCRIPTION OF EMBODIMENTS

The technical solutions in the embodiments of the present disclosure will be described clearly and completely in combination with the accompanying drawings. Obviously, the described embodiments are only a part of the embodiments of the present disclosure, but not all of the embodiments. Based on the embodiments in the present disclosure, all other embodiments obtained by those skilled in the art without creative efforts shall fall within the protection scope of the present application.

Unless otherwise defined, technical terms or scientific terms used herein should have the ordinary meaning as understood by those skilled in the art to which the present disclosure belongs. The terms "first", "second" and similar words used herein do not indicate any order, quantity, or importance, but are only used to distinguish different components. Words such as "include", "including", "comprise" or "comprising" mean that an element or item preceding the words encompasses elements or items following the words and their equivalents, without excluding other elements or items.

Figure 1:
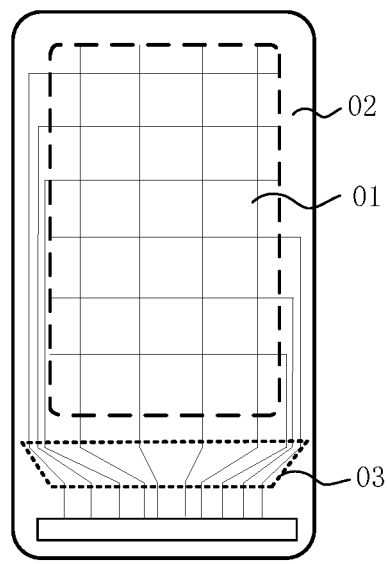
FIG. 1 is a schematic view illustrating an example of a display device in the related art.

FIG. 1 schematically illustrates an example of a perspective view of a display device in the related art. As shown in FIG. 1, the display device includes a display area 01 and a non-display area 02. Metal lines in the display area 01 are electrically connected to an IC (Integrated Circuit) in the non-display area 02 through leading lines provided in the non-display area 02. The leading lines are gathered in an area of the non-display area 02 before they are bonded to the IC. For example, the above-mentioned metal lines may be data lines. In this case, the leading lines are data leading lines. The area of the non-display area 02, in which the data leading lines are gathered, is usually referred to as a fanout area. One end of each of the leading lines in the fanout area is connected to the IC, and the other end thereof is connected to a signal line (such as data line) in the display area 01. The fanout area 03 is schematically shown in FIG. 1. It may be understood that a distribution density of the leading lines in the fanout area 03 is greater than a distribution density of the leading lines in other areas of the non-display area 02. These leading lines usually have a reflective property so that they may reflect ambient light entering the display device or light inside the display device. Since the distribution density of the leading lines in the fanout area 03 is greater, an intensity of light reflected by the leading lines in the fanout area 03 of the non-display area 02 is greater than an intensity of light reflected by the leading lines in the other areas of the non-display area 02. In addition, materials used for the leading lines in the fanout area 03 may be different, and different materials have different light reflection capabilities, and the distribution densities of the leading lines in the fanout area 03 are not uniform, so the light reflected by the fanout area 03 is not uniform. As a result, there is a difference in light reflection characteristic between the fanout area and the other areas of the non-display area, and there is an nonuniformity among the reflection characteristics inside the fanout area, so that the users may perceive different visual brightness, which may cause a relatively obvious "light leakage" phenomenon.

Some embodiments of the present disclosure provide a display device including a display panel and a light shielding pattern. The display panel includes a display area and a non-display area surrounding the display area. The display panel further includes a plurality of signal lines located in the display area and a plurality of signal leading lines located in the non-display area. The signal lines are electrically connected to the signal leading lines. The light shielding pattern is located on a light-exit side of the display panel. An orthographic projection of the light shielding pattern on the display panel is located within the non-display area, and the light shielding pattern is configured to block light reflected by the signal leading lines from exiting out from the light-exit side.

The "display panel" mentioned herein is a component of a display device. The display panel includes a base substrate and a pixel device (for example, an OLED or a liquid crystal layer) fabricated on the base substrate and capable of emitting light under appropriate conditions. For a liquid crystal display device, the display panel may include an array substrate, a color filter substrate, and a liquid crystal layer therebetween. For an organic light-emitting display device, the display panel may include a base substrate on which light-emitting pixels and a driving circuit thereof are formed.

Figure 2:
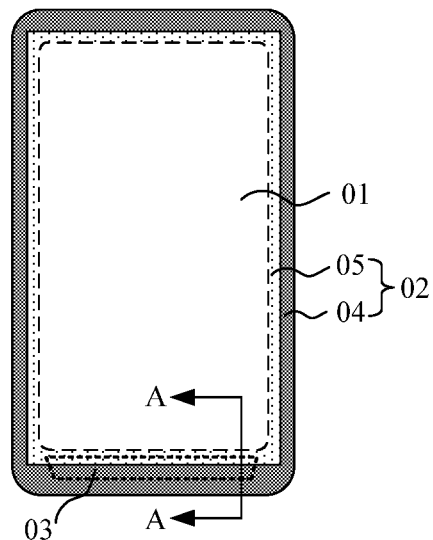
FIG. 2 is a schematic plan view of a display device provided by some embodiments of the present disclosure.
Figure 3:
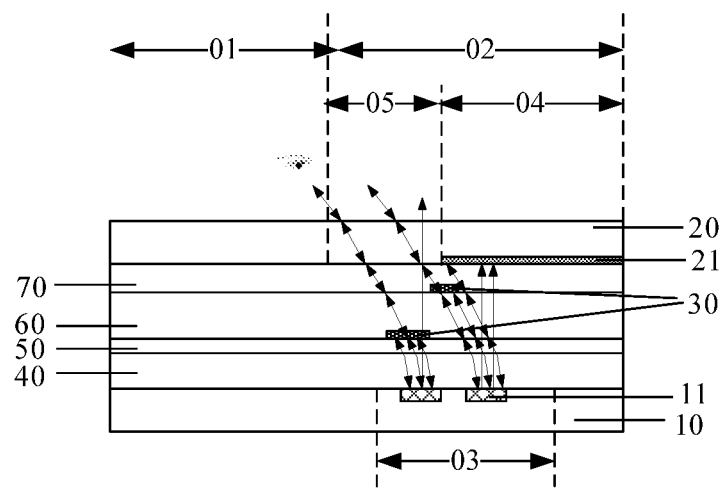
FIG. 3 is a cross-sectional view taken in A-A direction in FIG. 2, which further schematically illustrates an optical path of light reflected by signal leading lines.

An example of a display device according to some embodiments of the present disclosure will be described below with reference to FIG. 2 and FIG. 3. As shown in FIG. 2, the display area 01 of the display panel is an area surrounded by a dotted line shown in FIG. 2, and an area outside the display area 01 is a non-display area 02. The "display area" mentioned herein refers to a pixel area capable of emitting light when the display panel is driven. Similar to the example of FIG. 1, the display panel of the display device shown in FIG. 2 includes a plurality of signal lines in the display area and a plurality of signal leading lines in the non-display area. The signal leading lines are electrically connected to the signal lines. FIG. 2 is a plan view of the display device, and the signal lines and the signal leading lines are not shown in FIG. 2 in order to clearly illustrate the display area 01, the non-display area 02 and the fanout area 03 of the display device. The signal lines and the signal leading lines may refer to an example of FIG. 1. FIG. 3 is a partial cross-sectional view taken along line A-A in FIG. 2. As shown in FIG. 3, the display device includes a display panel 10, and the signal leading lines 11 are also shown schematically in FIG. 3. The display device further includes a light shielding pattern 30, which is located on the light-exit side of the display panel. An orthographic projection of the light shielding pattern 30 on the display panel is located within the non-display area 02. The light shielding pattern 30 is configured to block light reflected by the signal leading lines 11 from exiting out from the light-exit side.

It may be understood from the above description that the light shielding pattern in the display device according to the embodiments of the present disclosure is provided for the signal leading lines of the display panel, and it is arranged in the non-display area of the display panel without affecting a normal display of the display device. The light shielding pattern merely blocks the light reflected by the signal leading lines from exiting out from the light-exit side of the display panel. Therefore, the intensity of the light reflected by the non-display area of the display panel (including the "fanout area" mentioned above) and perceived by the user may be at least significantly reduced, thereby at least alleviating the aforementioned "light leakage" phenomenon.

According to some embodiments of the present disclosure, the above-mentioned signal lines may be data lines, in this case, the above-mentioned signal leading lines may include data leading lines.

The example of the display device in FIG. 3 also schematically illustrates a border pattern 21 of the display device. The border pattern is located on the light-exit side of the display panel 10. An orthographic projection of the border pattern 21 on the display panel 10 is located within the non-display area 02, and the orthographic projection of the light shielding pattern 30 on the display panel 10 at least partially overlaps with the orthographic projection of the border pattern 20 on the display panel 10. The expression "at least partially overlap" used herein may mean that the orthographic projection of the light shielding pattern 30 on the display panel 10 falls within the orthographic projection of the border pattern 20 on the display panel 10, or the orthographic projection of the border pattern 20 on the display panel 10 falls within the orthographic projection of the light shielding pattern 30 on the display panel 10, or there is an overlapped portion between the orthographic projection of the light shielding pattern 30 on the display panel and the orthographic projection of the border pattern 20 on the display panel 10.

In the example of FIG. 3, the light shielding pattern 30 is located on a side of the border pattern 21 adjacent to the display panel 10, that is, a vertical distance from the light shielding pattern 30 to the display panel 10 is smaller than a vertical distance from the border pattern 21 to the display panel 10. The border pattern 21 is located on a side adjacent to the display panel 10, of a cover plate 20 located above the display panel 10.

According to some embodiments of the present disclosure, as shown in FIG. 2 or FIG. 3, the non-display area 02 of the display panel includes an edge non-display area 04 and a middle non-display area 05. The edge non-display area 04 refers to an area of the non-display area corresponding to the above border pattern. The middle non-display area 05 is an area other than the edge non-display area 04 in the non-display area. The middle non-display area 05 does not include the border pattern. That is to say, in the example of FIG. 2, a window area surrounded by the border pattern of the display device (the area surrounded by an inner contour line of the dark-filled area) is larger than the display area 01 of the display device. In this way, a phenomenon that the border pattern shields the display area of the display device, which is caused by a bonding misalignment or insufficient process capability, may be avoided.

In some embodiments, at least a part of the orthographic projection of the light shielding pattern 30 on the display panel is located within a middle area between the display area 01 of the display panel and the orthographic projection of the border pattern 21 on the display panel. That is, for the example of FIG. 3, a part of the orthographic projection of the light shielding pattern 30 on the display panel 10 is located within the middle non-display area 05. In some embodiments, the orthographic projection of the light shielding pattern 30 on the display panel 10 falls within an orthographic projection of the middle non-display area 05 on the display panel 10, or the orthographic projection of the middle non-display area 05 on the display panel 10 falls within the orthographic projection of the light shielding pattern 30 on the display panel 10, or there is an overlapped portion between the orthographic projection of the light shielding pattern 30 on the display panel 10 and the orthographic projection of the middle non-display area 05 on the display panel 10.

In some embodiments, the orthographic projection of the light shielding pattern 30 on the display panel 10 overlaps with both an orthographic projection of the edge non-display area 04 on the display panel 10 and the orthographic projection of the middle non-display area 05 on the display panel 10. For example, in some embodiments, the orthographic projection of the light shielding pattern 30 on the display panel 10 coincides with the orthographic projection of the non-display area 02 on the display panel 10, or a part of the orthographic projection of the light shielding pattern 30 on the display panel 10 falls within the orthographic projection of the edge non-display area 04 on the display panel 10, and the other part of the orthographic projection of the light shielding pattern 30 on the display panel 10 falls within the orthographic projection of the middle non-display area 05 on the display panel 10.

In some embodiments, the orthographic projection of the light shielding pattern 30 on the display panel 10 is located within the fanout area 03.

The display device shown in FIG. 3 is an example of a self-luminous display device, for example, an OLED display device. FIG. 3 also schematically illustrates a cover plate 20, a packaging layer 40, a polarizer 50, a touch electrode layer 60, and an optical adhesive layer 70. The packaging layer 40 may include a packaging cover plate or a packaging film. In FIG. 3, although it is shown that the light shielding pattern 30 is arranged on the touch electrode layer 60 and the optical adhesive layer 70, the arrangement of the light shielding pattern proposed in the present disclosure is not limited thereto, and the light shielding pattern may be arranged only in a single layer structure, or may be arranged on multiple layer structures, which will be further described below.

The effect that the display device according to the embodiments of the present disclosure may reduce the above-mentioned "light leakage" phenomenon will be further described below with reference to FIGS. 2, 3 and 4.

Figure 4:
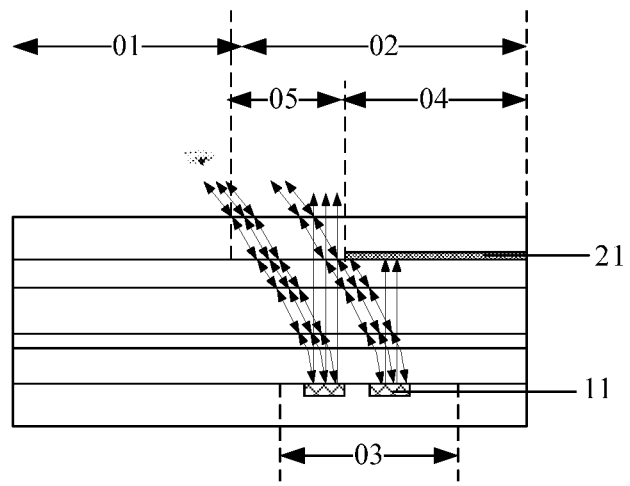
FIG. 4 is a schematic view illustrating an optical path of light reflected by signal leading lines when a light shielding pattern is not provided in the example of FIG. 3.

Assume that the display device shown in FIG. 2 is not provided with any "light shielding pattern" mentioned herein, in such a case, a partial cross-sectional view taken along line A-A in FIG. 2 is shown in FIG. 4. FIG. 4 also schematically illustrates an optical path of light reflected by signal leading lines. Referring to FIG. 4, there is no light shielding pattern in the middle display area 05 of the non-display area 02. When the signal leading lines 11 located in the non-display area 02 reflect external ambient light or light emitted from the display device, most of the light may directly exit out of a display surface of the display device, and then is perceived by the user, as indicated by the optical path of the light reflected by the signal leading lines 11 on the left side in FIG. 4. Although there is a border pattern 21 in the edge non-display area 04, in some viewing angles, the user may still perceive a part of the light reflected by the signal leading lines 11 in the edge non-display area 04, as indicated by the optical path of the light reflected by the signal leading lines 11 on the right side in FIG. 4. Therefore, for the example of FIG. 4, the light reflected by the signal leading lines 11 located in the non-display area 02 may be perceived by the user, and the above-mentioned "light leakage" phenomenon is likely to occur, which affects the user's experience of the display device adversely.

Referring to FIG. 3, FIG. 3 schematically illustrates an optical path of the light reflected by the signal leading lines 11 in the display device provided by some embodiments of the present disclosure. Similarly, in the example of FIG. 3, the display panel 10 includes a display area 01 and a non-display area 02. The non-display area 02 includes an edge non-display area 04 and a middle non-display area 05. The middle non-display area 05 is located between the display area 01 and the edge non-display area 04, and the fanout area 03 of the display panel is located in the non-display area 02. It may be well understood from FIG. 3 that after the light reflected by the signal leading lines 11 passes through the light shielding pattern 30, the intensity thereof is significantly reduced. That is, the light shielding pattern 30 may at least reduce the intensity of the light reflected by the signal leading lines 11. In this way, the user's sensitivity to the light reflected by the signal leading lines 11 may be reduced, and the aforementioned "light leakage" phenomenon may be alleviated.

As mentioned above, the embodiments of the present disclosure do not specifically limit the layer structures on which the light shielding pattern is disposed. For the example of FIG. 3, the light shielding pattern 30 may be disposed on any one or more layer structures selected from the packaging layer 40, the polarizer 50, the touch electrode layer 60, the optical adhesive layer 70 and so on. Also, it is possible to provide an additional film layer in the display device of FIG. 3 so as to specifically dispose the light shielding pattern 30 thereon. In one embodiment, the light shielding pattern may be attached to a single layer structure of the display device. For example, the light shielding pattern may be disposed only on the touch electrode layer 60. The material forming the light shielding pattern 30 includes, but is not limited to, ink. In some embodiments, the light transmittance of the light shielding pattern 30 may be adjusted by adjusting factors such as the material of the light shielding pattern 30 and the thickness of the light shielding pattern, so that the light shielding pattern may block the light reflected by the signal leading lines to different degrees.

It should be noted that although FIG. 3 schematically illustrates the optical paths of the light reflected by different signal leading lines 11, FIG. 3 does not represent all the optical paths of the light reflected by the signal leading lines 11. For example, in FIG. 3, reflected light from the middle non-display area 05 may include the light reflected by the signal leading lines located in the edge non-display area 04, or may also include the light reflected by the signal leading lines located in the middle non-display area 05. Moreover, the reflection here may be mirror reflection or diffuse reflection.

According to some embodiments of the present disclosure, various portions of the light shielding pattern may have inconsistent light transmittances. For example, an area in which the plurality of signal leading lines are located includes a first leading line area and a second leading line area. A light reflection capability of the first leading line area is higher than a light reflection capability of the second leading line area. The light shielding pattern includes a first pattern for blocking reflected light from the first leading line area and a second pattern for blocking reflected light from the second leading line area, and a light transmittance of the first pattern is lower than a light transmittance of the second pattern. That is to say, in this embodiment, the light shielding patterns 30 has different light transmittances in different areas so as to block or absorb the light reflected by the signal leading lines to different degrees.

Figure 5:
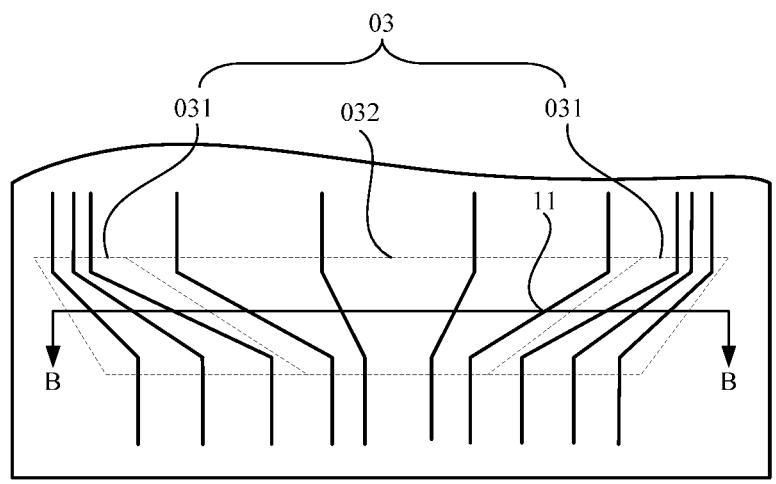
FIG. 5 is a schematic view of a "fanout area" in a display device according to some embodiments of the present disclosure.

This embodiment of the present disclosure will be specifically described below by way of example. FIG. 5 schematically illustrates an example of "fanout area 03" and signal leading lines (for example, data leading lines) in the fanout area according to some embodiments of the present disclosure. As shown in FIG. 5, the fanout area 03 includes a first fanout sub-area 031 and a second fanout sub-area 032. The light reflection capability of the signal leading lines 11 in the first fanout sub-area 031 is higher than the light reflection capability of the signal leading lines 11 in the second fanout sub-area 032. Therefore, in this example, the first fanout sub-area 031 may correspond to the first leading line area in the above embodiment and the second fanout sub-area 032 may correspond to the second leading line area in the above embodiment. In this case, the light shielding pattern includes a first pattern and a second pattern. The first pattern and the second pattern are used to block reflected light from different signal leading line areas, respectively, and the light transmittance of the first pattern is lower than that of the second pattern. In this way, the reflected light from the first leading line area with higher light reflection capability may be blocked by the first pattern to a higher degree, while the reflected light from the second leading line area may be blocked by the second pattern to a relatively low degree. Therefore, a difference between the light intensity of first reflected light from the first leading line area (for example, the first fanout sub-area 031) and the light intensity of second reflected light from the second leading line area (for example, the second fanout sub-area 032) may be reduced, thereby reducing the user's sensitivity to the light reflected by the signal leading lines and alleviating the aforementioned "light leakage" phenomenon. A relative positional relationship between the first fanout sub-area 031 and the second fanout area 032 is not limited herein. The positional relationship between the first fanout sub-area 031 and the second fanout area 032 shown in FIG. 5 is only an example. Also, the first fanout sub-area 031 may include multiple independent areas, and the second fanout sub-area 032 may also include multiple independent areas.

In some embodiments, the signal leading lines in the first fanout sub-area 031 and an anode of the organic light-emitting device of the self-luminous display panel are formed of the same material and formed through the same patterning process. That is, the signal leading lines 11 in the first fanout sub-area 031 and the anode of the organic light-emitting device are formed through the same patterning process (using the same mask). The material forming the anode may include, for example, ITO (Indium Tin Oxide), Ag (silver), or the like.

The light reflection capability of the signal leading line is mainly related to characteristics of its material. When multiple signal leading lines 11 are arranged together, the light reflection capability of the signal leading lines 11 in the fanout area is also related to the distribution density of the signal leading lines 11. In some embodiments, the distribution density of the signal leading lines in the first leading line area is greater than the distribution density of the signal leading lines in the second leading line area. For example, in the example of FIG. 5, the distribution density of the signal leading lines 11 in the first fanout sub-area 031 is greater than the distribution density of the signal leading lines 11 in the second fanout sub-area 032. Therefore, the intensity of the reflected light in the first fanout sub-area 031 may be higher than the intensity of the reflected light in the second fanout sub-area 032. In other embodiments, the reflectance of the material of the signal leading line 11 in the first fanout sub-area 031 is different from that of the material of the signal leading line 11 in the second fanout sub-area 031, which may also result in different light reflection capabilities in different leading line areas.

Figure 6:
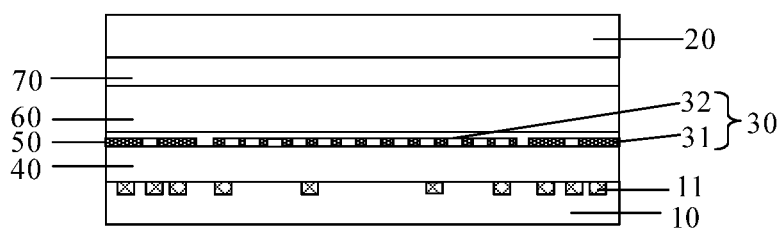
FIG. 6 is a schematic cross-sectional view taken in B-B direction in FIG. 5.

Therefore, in a case where the area in which the signal leading lines are located includes multiple leading line areas having different light reflection capabilities, multiple portions of the light shielding pattern may have inconsistent light transmittances. FIG. 6 is a partial cross-sectional view of FIG. 5 taken along a line B-B in FIG. 5. As shown in FIG. 6, the light shielding pattern 30 includes a first pattern 31 corresponding to the first fanout sub-area 031 and a second pattern 32 corresponding to the second fanout sub-area 032. The light transmittance of the first pattern 31 is lower than the light transmittance of the second pattern 32. In the example of FIG. 6, the light reflection capability of the signal leading lines 11 in the first fanout sub-area 031 is higher than that of the signal leading lines in the second fanout sub-area 032, and the light reflection capability of the signal leading lines in the second fanout sub-area 032 is higher than the light reflection capability of the signal leading lines in the other area of the non-display area 02 except the fanout area 03. The first pattern with a lower light transmittance blocks the first reflected light from the first fanout sub-area 031, so that the intensity of the first reflected light is greatly reduced. The second pattern with a relatively high light transmittance blocks the second reflected light from the second fanout sub-area 032, so that the intensity of the second reflected light is reduced to a small degree. In this way, the difference between the intensities of the light reflected by the signal leading lines in different areas may be reduced, which is beneficial to improving the comfort of the user when using the display device.

As shown in FIG. 6, in some embodiments, the light shielding pattern includes a hollow pattern, and a proportion of the hollow portion of the first pattern 31 is smaller than a proportion of the hollow portion of the second pattern 32. In other embodiments, the light shielding pattern includes a plurality of strips, and a density of the strips of the first pattern is greater than a density of the strips of the second pattern. In this way, it is possible to realize that the first pattern and the second pattern have different light transmittances. Here, the specific shape of the hollow pattern is not limited. In the case where the light shielding pattern includes a plurality of hollow patterns, the shapes of the hollow patterns may not be completely the same. For example, a plurality of small holes may be provided in the light shielding pattern 30, and the light transmittance of the light shielding pattern 30 may be adjusted by adjusting parameters such as a distribution density and sizes of the small holes. In the case where the light shielding pattern 30 includes a plurality of strips, the light transmittance of the light shielding pattern 30 may be adjusted by adjusting a space between the strips.

In some embodiments, the light shielding pattern may be formed by coating ink on some layer structures above the display panel. In some embodiments, a width of the light shielding pattern in a direction perpendicular to an edge of the display area closest to the light shielding pattern ranges from 0.5 mm to 1 mm. For example, the width of the light shielding pattern 30 shown in FIG. 3 may range from 0.5 mm to 1 mm.

As mentioned above, in some embodiments, the light shielding pattern may be arranged on a plurality of different layer structures above the display panel. In this case, sizes of the light shielding patterns on different layer structures may be different. The sizes of the light shielding pattern may be determined according to a distance between the light shielding pattern and the signal leading lines, so that the light shielding pattern blocks the light reflected by the signal leading lines from exiting out from the light-exit side, or different light shielding patterns block the reflected light from different leading line areas to different degrees. Furthermore, when implementing the embodiments of the present disclosure, the light shielding pattern 30 may be disposed on a side of the layer structure distal to the display panel, or may be disposed on a side of the layer structure adjacent to the display panel.

Specific forms of the display device are not limited herein. The display device herein may specifically include an OLED display, a television, a digital photo frame, a mobile phone, a tablet computer, a navigator, or any other product or component with any display function.

The above descriptions are only specific implementations of the present disclosure, but the scope of the present application is not limited thereto. Those skilled in the art can easily think of changes or substitutes within the technical scope disclosed in the present disclosure, and these changes or substitutes should be covered by the scope of the present application. Therefore, the scope of the present application shall be subject to the scope of the claims.

What is claimed is:

1. A display device, comprising:
    a display panel comprising a display area and a non-display area surrounding the display area, the display panel further comprising a plurality of signal lines in the display area and a plurality of signal leading lines in the non-display area, and the plurality of signal leading lines being electrically connected to the plurality of signal lines, respectively;
    a border pattern on a light-exit side of the display panel, an orthographic projection of the border pattern on the display panel being located within the non-display area; and
    a light shielding pattern on the light-exit side of the display panel and on a side of the border pattern adjacent to the display panel,
    wherein an orthographic projection of the light shielding pattern on the display panel is located within the non-display area, and the light shielding pattern is configured to block light reflected by the plurality of signal leading lines from exiting out from the light-exit side;
    wherein various portions of the light shielding pattern have inconsistent light transmittances;
    wherein an area in which the plurality of signal leading lines are located comprises a first leading line area and a second leading line area, and a light reflection capability of the first leading line area is higher than a light reflection capability of the second leading line area; and
    wherein the light shielding pattern comprises a first pattern for blocking reflected light from the first leading line area and a second pattern for blocking reflected light from the second leading line area, and a light transmittance of the first pattern is lower than a light transmittance of the second pattern.

2. The display device of claim 1, wherein the plurality of signal lines comprise a plurality of data lines, and the plurality of signal leading lines comprise a plurality of data leading lines.

3. The display device of claim 1, wherein
    the orthographic projection of the light shielding pattern on the display panel at least partially overlaps with the orthographic projection of the border pattern on the display panel.

4. The display device of claim 1, wherein
    at least a part of the orthographic projection of the light shielding pattern on the display panel is located within a middle area between the display area of the display panel and the orthographic projection of the border pattern on the display panel.

5. The display device of claim 1, wherein the display device comprises a touch electrode layer on the light-exit side of the display panel, and the light shielding pattern is arranged on the touch electrode layer.

6. The display device of claim 1, wherein the display device further comprises a layer structure on the light-exit side of the display panel, the light shielding pattern is connected to the layer structure, and the layer structure comprises at least one of a packaging layer, a polarizer, a touch electrode layer, or an optical adhesive layer.

7. The display device of claim 1, wherein the display device further comprises a cover plate above the display panel, and the border pattern is formed on the cover plate.

8. The display device of claim 1, wherein a distribution density of the signal leading lines in the first leading line area is greater than a distribution density of the signal leading lines in the second leading line area.

9. The display device of claim 1, wherein each of the first pattern and the second pattern comprises a hollow portion, and a proportion of the hollow portion in the first pattern is smaller than a proportion of the hollow portion in the second pattern.

10. The display device of claim 1, wherein the light shielding pattern comprises a plurality of strips, and a density of the strips in the first pattern is greater than a density of the strips in the second pattern.

11. The display device of claim 1, wherein a material forming the light shielding pattern comprises ink.

12. The display device of claim 1, wherein a width of the light shielding pattern in a direction perpendicular to an edge of a display area closest to the light shielding pattern ranges from 0.5 mm to 1 mm.

13. The display device of claim 3, wherein at least a part of the orthographic projection of the light shielding pattern on the display panel is located within a middle area between the display area of the display panel and the orthographic projection of the border pattern on the display panel.

14. The display device of claim 1, wherein the display device further comprises a fanout area in the non-display area, the plurality of signal leading lines are gathered in the fanout area, and an orthographic projection of the light shielding pattern on the display panel is located within the fanout area.

15. The display device of claim 1, wherein an orthographic projection of the border pattern on the display panel surrounds the display area, and an area of a region surrounded by the orthographic projection of the border pattern on the display panel is greater than an area of the display area.

* * * * *